United States Patent
Chu et al.

(10) Patent No.: US 9,577,623 B2
(45) Date of Patent: Feb. 21, 2017

(54) CAPACITIVE PARAMETRIC ZERO CROSSING DETECTOR DEVICE, CIRCUIT AND METHOD

(71) Applicant: Microchip Technology Incorporated, Chandler, AZ (US)

(72) Inventors: Ching Chu, San Jose, CA (US); Benedict Choy, Cupertino, CA (US); Andy Tu, Saratoga, CA (US)

(73) Assignee: Microchip Technology Inc., Chandler, AZ (US)

( * ) Notice: Subject to any disclaimer, the term of this patent is extended or adjusted under 35 U.S.C. 154(b) by 606 days.

(21) Appl. No.: 14/021,910

(22) Filed: Sep. 9, 2013

(65) Prior Publication Data

US 2015/0070034 A1    Mar. 12, 2015

(51) Int. Cl.
*H03K 5/1536* (2006.01)
*G01R 19/175* (2006.01)

(52) U.S. Cl.
CPC ........... *H03K 5/1536* (2013.01); *G01R 19/175* (2013.01)

(58) Field of Classification Search
CPC .............. G01R 27/2694; G01R 19/175; G01R 27/2605; H03K 5/1536
USPC ......................................................... 324/679
See application file for complete search history.

(56) References Cited

U.S. PATENT DOCUMENTS

| | | | | |
|---|---|---|---|---|
| 4,939,789 A | * | 7/1990 | Sakashita | H03D 5/00 348/733 |
| 6,424,407 B1 | * | 7/2002 | Kinrot | G01D 5/347 345/166 |
| 2007/0164833 A1 | * | 7/2007 | Kottschlag | H03J 3/185 331/177 V |
| 2008/0203537 A1 | * | 8/2008 | Anderson | H01L 29/417 257/601 |
| 2008/0290465 A1 | * | 11/2008 | de Vreede | |
| 2009/0134960 A1 | * | 5/2009 | Larson | H01L 29/93 334/78 |
| 2012/0146188 A1 | * | 6/2012 | Chen | H01L 27/0635 257/596 |

* cited by examiner

*Primary Examiner* — Melissa Koval
*Assistant Examiner* — Courtney McDonnough
(74) *Attorney, Agent, or Firm* — Burr & Forman LLP; Ryan M. Corbett (57) ABSTRACT

A capacitive parametric zero crossing detection circuit has a nonlinear voltage controlled capacitive device coupled to an input voltage to convert a zero crossing current pulse into zero crossing voltage signal.

26 Claims, 7 Drawing Sheets

CAPACITIVE PARAMETRIC ZERO CROSSING DETECTOR DEVICE, CIRCUIT AND METHOD

RELATED APPLICATIONS

The present application is related to U.S. Patent Application entitled, "ULTRASOUND CAPACITIVE T/R SWITCH DEVICE, CIRCUIT AND METHOD", Filed Aug. 13, 2013, and having U.S. Ser. No. 13/965,490 in the name of Ben Choy, Ching Chu, and Andy Tu.

TECHNICAL FIELD

This invention relates generally to an electronic circuit and, more specifically to a capacitive parametric zero crossing detection circuit and a semiconductor device for application as a capacitive parametric zero crossing detector device.

BACKGROUND

In general, waveform zero-crossing detection circuits have been widely used in Silicon Controlled Rectifiers (SCR), Triode for Alternating Current (TRIAC) control, Solid State Relay (SSR) control, DC/DC and AC/DC convertor control, DC and AC motor control and frequency and phase measurements, phase looked loops and numerous other application areas. In general, most zero crossing detection circuits contain a waveform sampling or current shutter or voltage divider circuit, and a bidirectional voltage comparison circuit compare with some zero car low voltage reference etc. These circuits generally require many electronic components including voltage comparator integrated circuits which are generally quite expensive. A simple, low-cost and accurate zero-crossing detector would have wide demanded for a multiple of different applications. Unfortunately, simple, low-cost acid accurate zero-crossing detectors are currently not available. Therefore, it would be desirable to provide a low cost device, circuit and method that overcome the above problems.

SUMMARY

This summary is provided to introduce a selection of concepts in a simplified form that are further described below in the DESCRIPTION OF THE APPLICATION. This summary is not intended to identify key features of the claimed subject matter, nor is it intended to be used as an aid in determining the scope of the claimed subject matter.

A capacitive parametric zero crossing detection circuit has a nonlinear voltage controlled capacitive device. A resistive element is coupled to the nonlinear voltage controlled switch to convert a zero crossing current pulse into a zero crossing voltage signal.

A capacitive parametric zero crossing detection circuit has a nonlinear voltage controlled capacitive device coupled to an input voltage to convert a zero crossing current pulse into zero crossing voltage signal.

The features functions, and advantages may be achieved independently in various embodiments of the disclosure or may be combined in yet other embodiments.

BRIEF DESCRIPTION OF DRAWINGS

The novel features believed to be characteristic of the disclosure are set forth in the appended claims. In the descriptions that follow, like parts are marked throughout the specification and drawings with the same numerals, respectively. The drawing FIGURES are not necessarily drawn to scale and certain FIGURES can be shown in exaggerated or generalized form in the interest of clarity and conciseness. The disclosure itself, however, as well as a preferred mode of use, further objectives and advantages thereof, will be best understood by reference to the following detailed description of illustrative embodiments when read in conjunction with the accompanying drawings, wherein:

DESCRIPTION OF THE DISCLOSURE

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

Figure 1:
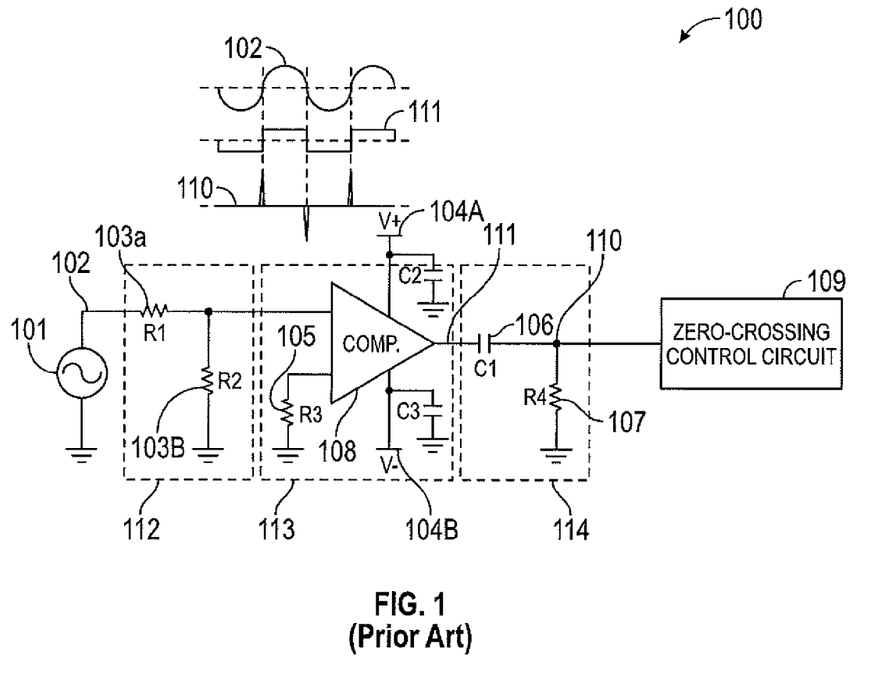
FIG. 1 is a schematic diagram illustrating a conventional AC line voltage waveform zero crossing detection circuit.

Referring to FIG. 1, a schematic diagram illustrating a conventional AC line voltage waveform zero crossing detection circuit 100 (hereinafter circuit 100) is shown. The circuit 100 generally has three stages of sub-circuits. The first stage may be a voltage or current waveform sampling circuit 112 which is coupled to an input voltage 101. The voltage or current waveform sampling circuit 112 may be comprised of a pair of resistive devices R1 103A and R2 103B. The two resistive devices R1 103A and R2 103B form a simple voltage divider circuit. The voltage divider drops down and lowers peak to peak voltages which the followed second stage 113 may be able to process. The second stage is an amplification gain or comparison means (comparator) stage 113. The operational amplifier or comparator stage 114 may be used to convert a sine wave in to a "square" wave 111, with much fast rise and fall edges. In the embodiment shown in FIG. 1, the operational amplifier or comparator stage 113 may be an op amp 108. The op amp 108 has a first input coupled to the first stage voltage or current waveform sampling circuit 112. A second input may be coupled to a resistive element R3 105. The op amp 108 may be coupled to voltage rails V+ and V−. The voltage rails V+ and V− may he coupled to capacitive elements C2 and C3 respectively.

The output of the op amp 108 may be sent to a third stage 114. The third stage may be a high-pass filter or differential circuit 114. In the embodiment shown in FIG. 1, the high-pass filter or differential circuit 114 may be comprised of a capacitor C1 106 and a resistive element R4 107. The high-pass filter or differential circuit 114 may be used to further process the square waveform into the zero crossing pulses 110.

Figure 2:
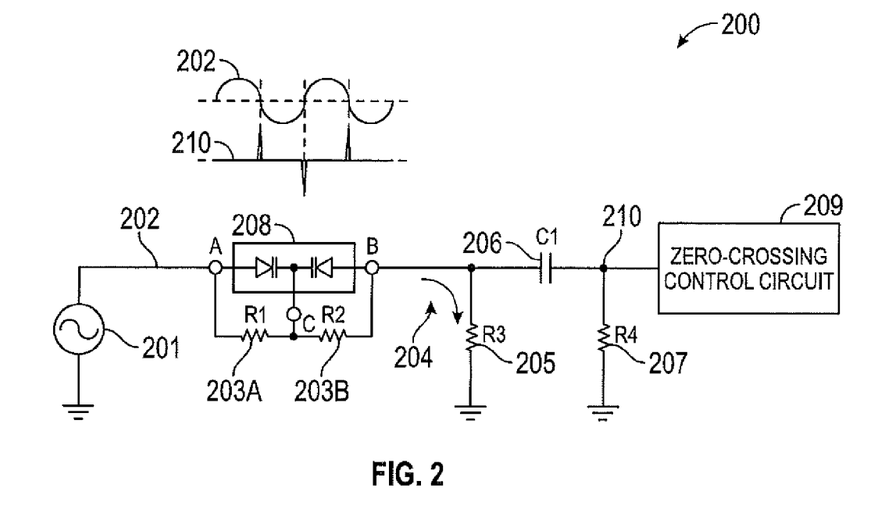
FIG. 2 is a schematic diagram illustrating a capacitive parametric zero crossing detection circuit of the present invention.

Referring now to FIG. 2, a novel capacitive parametric zero crossing detection circuit 200 of the present invention is shown. The capacitive parametric zero crossing detection circuit 200 uses a 2-terminal nonlinear voltage controlled capacitive device 208 to replace the conventional op-amp circuit 108 (FIG. 1). Unlike the comparator or op-amp circuit 108, no power supply is required for the 2-terminal nonlinear voltage controlled capacitive device 208.

The capacitive parametric zero crossing detection circuit 200 has an input voltage source 201 which generates a high voltage wave 202. When a high voltage wave 202 is applied to the nonlinear voltage controlled capacitive device 208 terminal A, the current 204 pass the nonlinear voltage controlled capacitive device 208 will drop on the resistive element R3 205. The junction capacitance of the nonlinear voltage controlled capacitive device 208 is normally very low if the terminal voltage is higher than the +/−$V_{KN}$, thus the current pass it is generally very low. When the terminal voltage goes below or near +/−$V_{KN}$ the current jumps because the device junction capacitance rapidly increases. Because the +/−VKN is very low or close to zero, therefore the current pulse due to the novel capacitive parametric nonlinearity of the voltage controlled capacitive device 208 becomes a high voltage zero crossing signal. The polarity of the zero crossing signals will be able to fully and accurately follow the slop direction of the input waveform zero crossing direction. The zero crossing signals are then sent through a high-pass filter or differential circuit which may be comprised of a capacitor C1 206 and a resistive element R4 207. The high-pass filter or differential circuit may be used to further process the square waveform into the zero crossing pulses 110.

A pair of high value bleed resistive elements R1 203A and R2 203B are coupled to the output of the nonlinear voltage controlled capacitive device 208. The resistive elements R1 203A and R2 203B may be used to provide the nonlinear voltage controlled capacitive device 208 an initialization state. The resistive elements R1 203A and R2 203B may be easily integrated into a semiconductor device.

Figure 3:
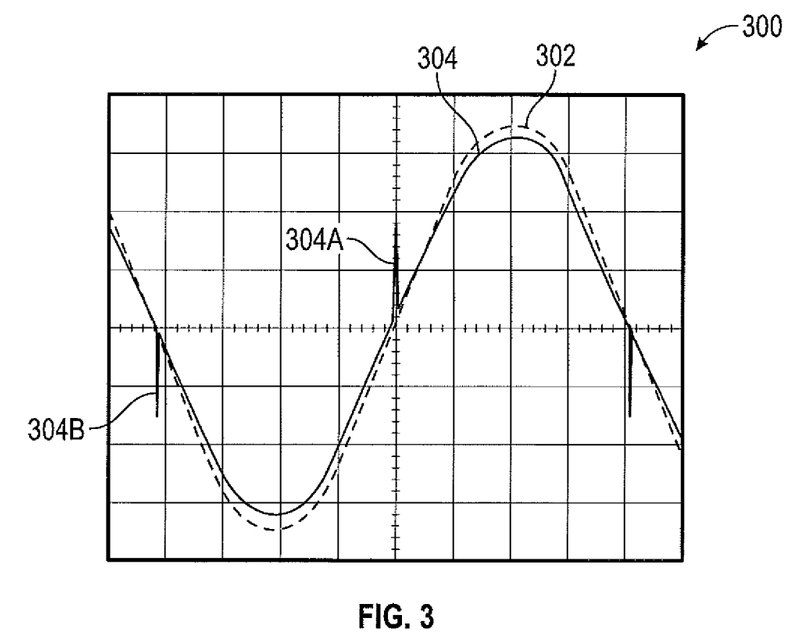
FIG. 3 is an oscilloscope picture illustrating the capacitive parametric zero crossing detection circuit as shown in the FIG. 2, working waveforms example.

Referring to FIGS. 2-3, wherein FIG. 3 is an oscilloscope picture 300 illustrating the capacitive parametric zero crossing, detecting circuit 200 as shown in the FIG. 2, a working waveforms example is shown In this example, the input 201 is a 115V AC line 60 Hz Sine wave voltage source. The input waveform 202 of FIG. 2 is recorded as the waveform 302 in. FIG. 3, and the current 204 waveform shown in FIG. 2 as the voltage drop on the resistive element R3 105 is recorded as the waveform 304 in FIG. 3. The 304A and 304B marks are the positive and negative zero crossing current peaks superimposed on the sine wave current 304.

Figure 4A:
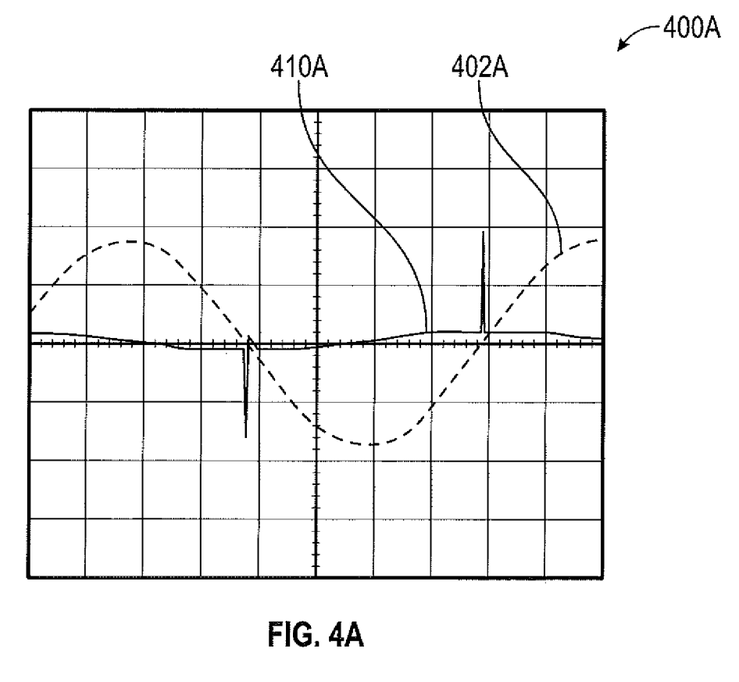
FIG. 4A is another oscilloscope picture illustrating the new novel type of the capacitive parametric zero crossing detecting circuit as shown in the FIG. 2, working waveforms example.

Referring now to FIG. 4A, an oscilloscope picture illustrating the capacitive parametric zero crossing detecting circuit 200 as shown in the FIG. 2, working waveforms example is shown. In this example the input 201 is 115V AC line 60 Hz Sine wave voltage source. The input waveform 202 of FIG. 2 is recorded as the waveform 402A in FIG. 4A, and the current 204 waveform shown in FIG. 2 as the voltage drop on the resistive element R3 205 and further through the high pass filter 216 formed of the capacitor C1 206 and the resistive element R4 207, recorded as the waveform 410A in FIG. 4A. The waveform 410A has the positive and negative zero crossing current peaks superimposed on the much less amplitude of 60 Hz sine waveform.

Figure 4B:
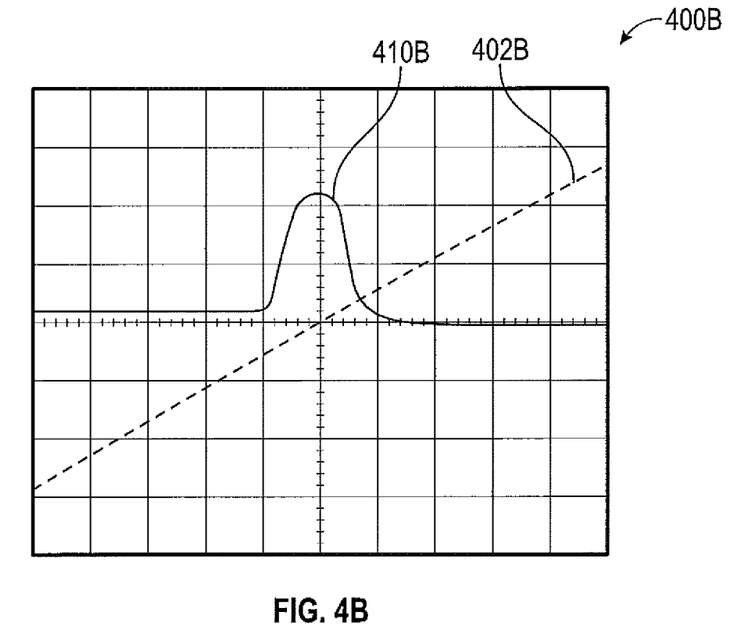
FIG. 4B is zoomed in time domain near the positive zero crossing point of an oscilloscope picture FIG. 4A, working waveforms example.

Referring now to FIGS. 2 and 4B, FIG. 4B is a zoomed in time domain near the positive zero crossing point of the oscilloscope picture shown in FIG. 4A, working waveforms example. In this example the input 201 is a 115V AC line 60 Hz Sine wave voltage source of FIG. 2. The input waveform 202 of FIG. 2 is recorded as the waveform 402B in FIG. 4B, and the current 204 waveform of FIG. 2 as the voltage drop on the resistive element R3 205 shown in FIG. 2 and through the high pass filter 216 formed of the capacitor C1 206 and the resistive element R4 207, is recorded as the waveform 410B. The waveform 410B has the positive zero crossing current peaks superimposed on the much less amplitude of 60 Hz sine waveform.

Figure 4C:
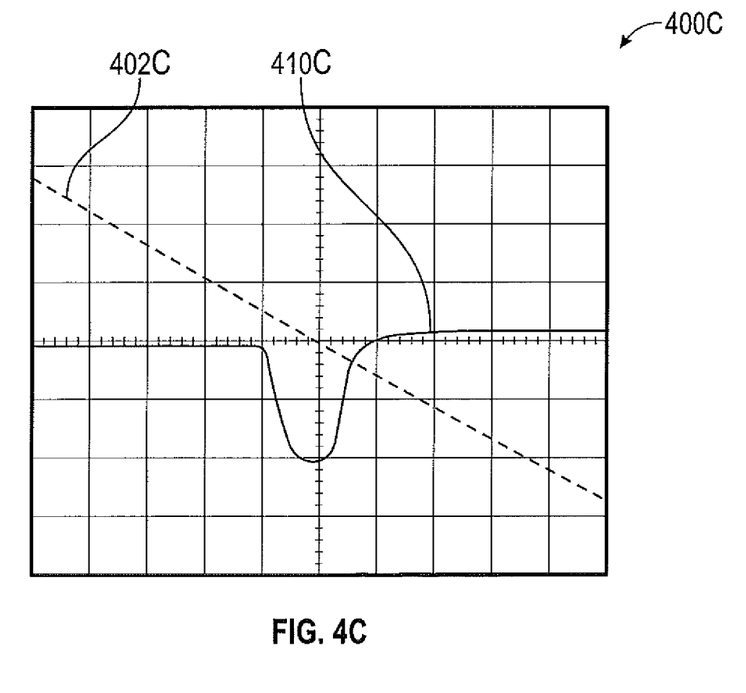
FIG. 4C is zoomed in time domain near the negative zero crossing point an oscilloscope picture FIG. 4A, working waveforms example.

Referring now to FIGS. 2 and 4C, FIG. 4C is a zoomed in time domain near the negative zero crossing point of the oscilloscope picture shown in FIG. 4A, working waveforms example. In this example the input 201 is 115V AC line 60 Hz Sine wave voltage source of FIG. 2. The input waveform 202 (FIG. 2) is recorded as the waveform 402C, and the current 204 (FIG. 2) waveform as the voltage drop on the resistive element R3 205 (FIG. 2), further through the high pass filter (capacitor C1 206 and resistive element R4 207 (FIG. 2)), recorded as the waveform 410C. The 410C has the negative zero crossing current peaks superimposed on the much less amplitude of 60 Hz sine waveform.

Figure 5:
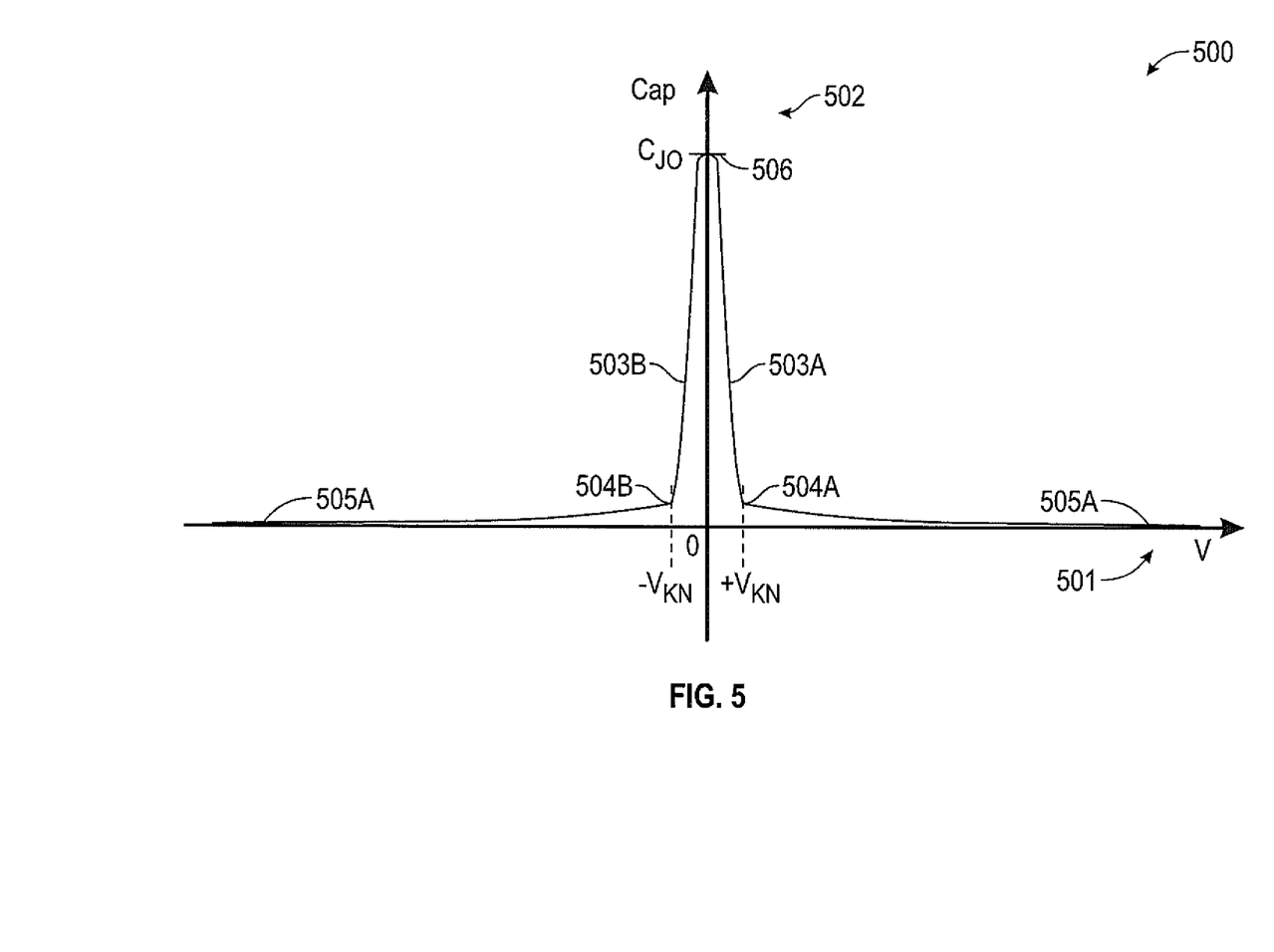
FIG. 5 is a C-V curve diagram illustrating a nonlinear voltage controlled capacitive device's terminal A to terminal B capacitance vs. the voltage across the two terminals used in the capacitive parametric zero crossing detection circuit of the present invention.

Referring now to FIG. 5, the nonlinear voltage controlled capacitive device 208 (FIG. 2) has a typical C-V curve 500 as shown in FIG. 5. The capacitance between terminal A and B, when the terminal voltage is zero, $C_{JO}$ 506 is very high. Normally, the $C_{JO}$ is design to be about a few hundreds of picofarad (pF) to few nanofarad (nF). When the terminal voltage increases, within +/−200-300 mV, the terminal capacitance gradually and slowly decreases. However when the terminal voltage drop further increases to about +/−0.5- 0.7V, the capacitance rapidly falls as shown in the curve section of 503A and 503B. Then with the absolute voltage further increases and reaches to near the +/−$V_{KN}$ voltage (i.e., where C-V curve knee points are), the capacitance will be only a few percent of the $C_{JO}$ value. When the terminal absolute voltage continuous to increase, the capacitance will continue to decrease just like the C-V curve of a normal reverse biased P-N junction behaves. The nonlinear voltage controlled capacitive device 208 (FIG. 2) has a breakdown voltages normally higher than the maximum Tx pulses peak to peak voltages, about +/−30 to +/−250V range.

Figure 6A:
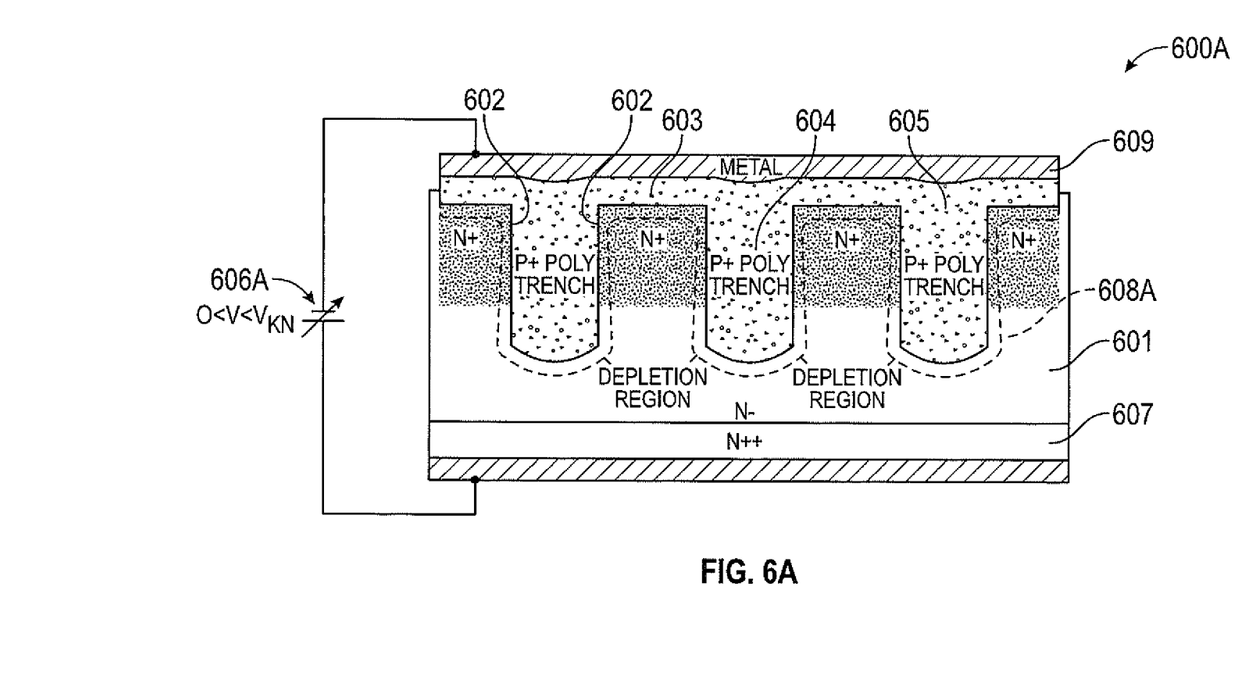
FIG. 6A is a single device semiconductor structure diagram illustrating the nonlinear voltage controlled capacitive device, with zero or near zero bias voltage.
Figure 6B:
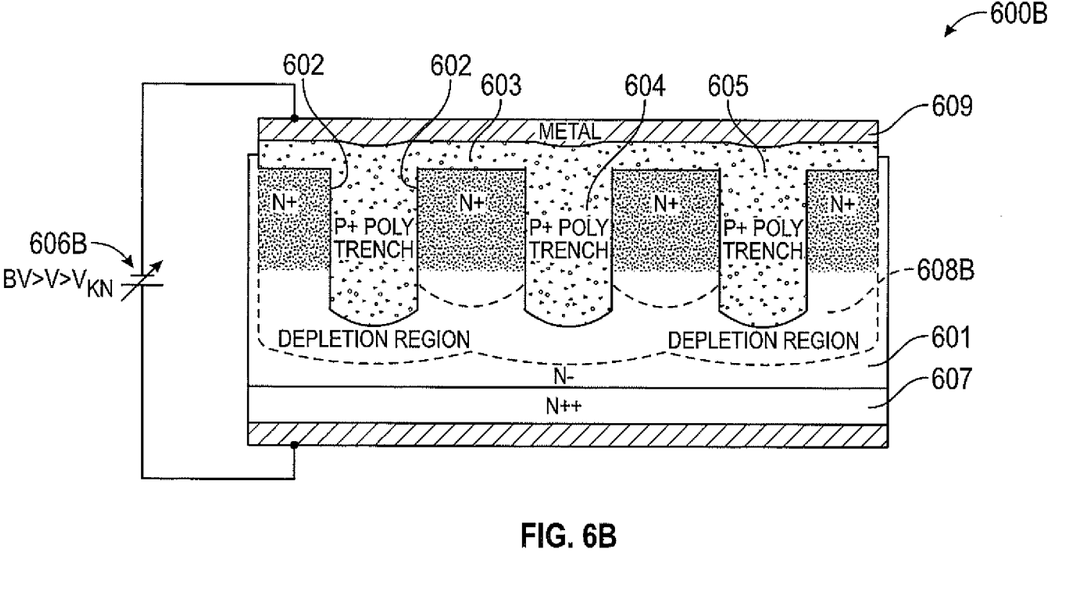
FIG. 6B is a single device semiconductor structure diagram illustrating the nonlinear voltage controlled capacitive device, with larger or slightly larger than knee voltage ($V_{KN}$) voltage(s)

Referring now to FIGS. 6A-6B, in the present invention, the nonlinear voltage controlled capacitive device 208 is implemented using a specially designed semiconductor device 600A (FIG. 6A) and 600B (FIG. 6B). The semiconductor device 600A (FIG. 6A) and 600B (FIG. 6B) may be fabricated on an n-type semiconductor substrate material 601 each with a plurality of p-type poly 603 material in the trenches 602. Because the vertical structure of the trenches 602, there are larger areas of the P-N junctions present on the side walls of each trench 602, as well as only a very small percentage of the same type of junction at the bottom of the trenches 602. Due to the concentration of N+ area being much higher than the N− area, the unit area junction capacitance of side walls are higher. When the terminal voltage 606A is at zero or near zero, due to the all the function area being together, contribute to the junction capacitance as a large $C_{JO}$. When terminal voltage 606B increases to the knee or near knee voltage $+/-V_{KN}$, the depletion region between two trenches 602 are pinched off. The effective reversed biased P-N junction are suddenly and quickly reduces to a very small area, which only the bottom area of the trench 602. Therefore the effective junction capacitance rapidly reduced. The semiconductor device 608A shows the depletion area of zero or near zero bias and the semiconductor device 608B shows when the bias is at near knee voltage or higher. The semiconductor devices 608A/608B have a metal layer 607 as the cathode and metal layer 609 as the anode terminal connections respectively.

Figure 7:
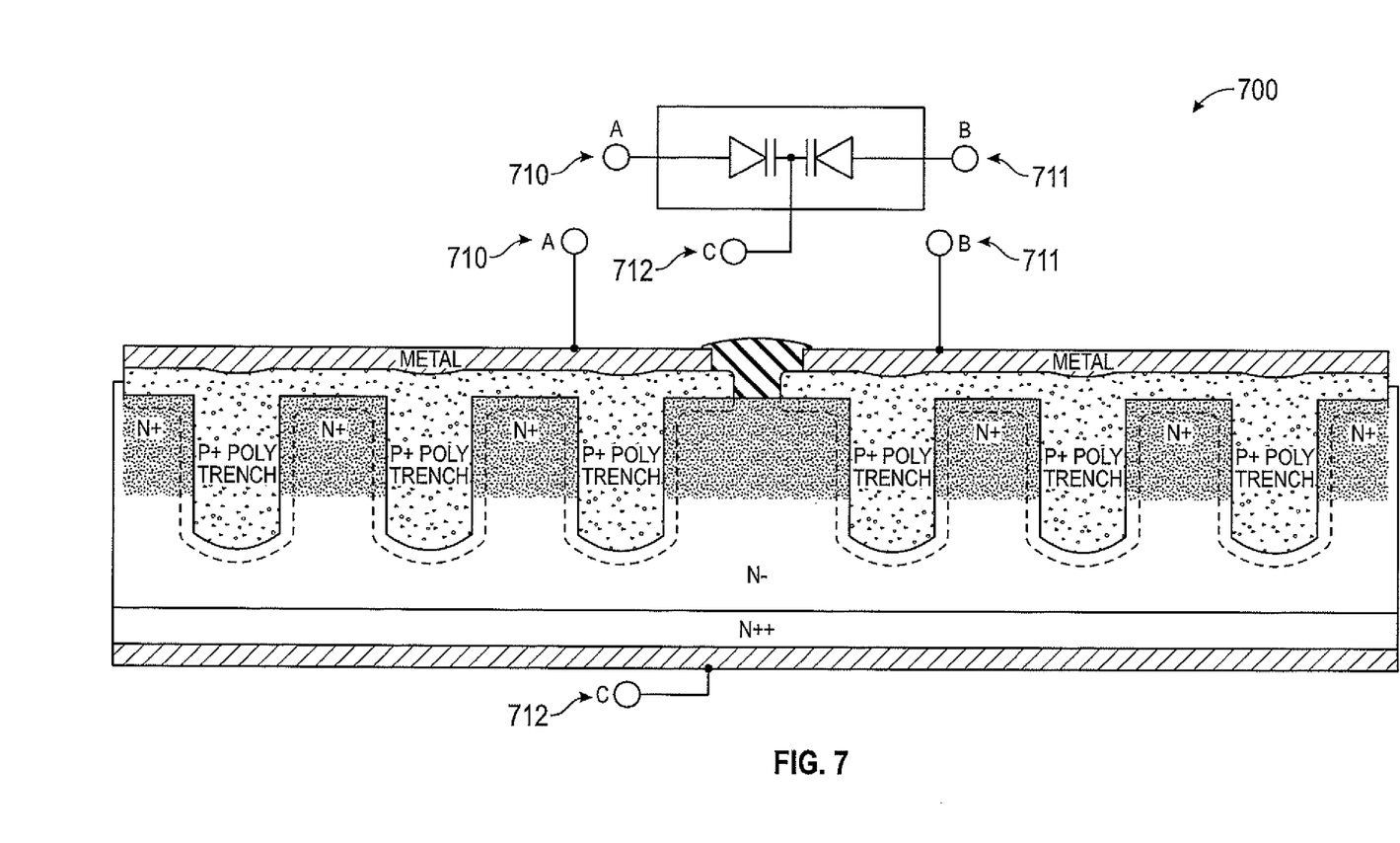
FIG. 7 is a back to back dual devices semiconductor structure diagram illustrating the nonlinear voltage controlled capacitive device, with three terminals.

Referring to FIG. 7, in the present embodiment, a three terminal nonlinear voltage controlled capacitive device 700 is implemented using a pair of the semiconductor devices 608A/608B (FIG. 6A/6B). The nonlinear voltage controlled capacitive device 700 is fabricated with two separated group of said p-type poly trenches device. The back-to back semiconductor devices 608A/608B of FIG. 6A/6B has common cathode 712 metal, and the two anodes metal 710 and 711 as the terminals-A and the terminals-B. The simplified schematic symbol, without the initialization bleed-resistors, is shown above in the FIG. 7 correspondingly The foregoing description is provided to enable any person skilled in the relevant art to practice the various embodiments described herein. Various modifications to these embodiments will be readily apparent to those skilled in the relevant art, and generic principles defined herein can be applied to other embodiments. Thus, the claims are not intended to be limited to the embodiments shown and described herein, but are to be accorded the full scope consistent with the language of the claims, wherein reference to an element in the singular is not intended to mean "one and only one" unless specifically stated, but rather "one or more." All structural and functional equivalents to the elements of the various embodiments described throughout this disclosure that are known or later come to be known to those of ordinary skill in the relevant art are expressly incorporated herein by reference and intended to be encompassed by the claims. Moreover, nothing disclosed herein is intended to be dedicated to the public regardless of whether such disclosure is explicitly recited in the claims.

What is claimed is:

1. A capacitive parametric zero crossing detection circuit comprising:
    a voltage controlled capacitive nonlinear device; and
    a resistive element coupled to the nonlinear voltage controlled capacitive device to convert a zero crossing current pulse into a zero crossing voltage signal;
    wherein the nonlinear voltage controlled capacitive device is a semiconductor device comprising:
    a substrate of a first doping type having a plurality of trenches formed therein;
    a poly-Silicon material of a second doping type formed within each of the plurality of trenches; and
    metal layers applied to the substrate and the poly-Silicon material to form terminals of the nonlinear voltage controlled capacitive device.

2. The capacitive parametric zero crossing detection circuit of claim 1 further comprising a high-pass filter coupled to the nonlinear voltage controlled capacitive device.

3. The capacitive parametric zero crossing detection circuit of claim 2 wherein the high pass filter comprises:
    a capacitive element coupled to the nonlinear voltage controlled capacitive device; and
    a resistive element coupled to the capacitive element.

4. The capacitive parametric zero crossing detection circuit of claim 1, wherein the nonlinear voltage controlled capacitive device comprises:
    a pair of diodes; and
    a pair of bleed resistors coupled to the pair of diodes.

5. The capacitive parametric zero crossing detection circuit in accordance with claim 1, wherein the nonlinear voltage controlled capacitive device generates a C-V curve in which a capacitance at a near zero voltage is at least 50 times greater than a capacitance at a knee point voltage of the C-V curve.

6. The capacitive parametric zero crossing detection circuit of claim 1, wherein the substrate is an N-type substrate, and the poly-Silicon material is a P-type poly-Silicon material.

7. The capacitive parametric zero crossing detection circuit of claim 1, wherein the substrate is a P-type substrate, and the poly-Silicon material is an N-type poly-Silicon material.

8. The capacitive parametric zero crossing detection circuit of claim 6, wherein a junction capacitance of at least one of the trenches changes with a terminal voltage, the junction capacitance having a C-V curve in which a capacitance at a near zero voltage is at least 50 times greater than a capacitance at a knee point voltage of the C-V curve.

9. The capacitive parametric zero crossing detection circuit of claim 7, wherein a junction capacitance of at least one of the trenches changes with a terminal voltage, the junction capacitance having a C-V curve in which a capacitance at a near zero voltage is at least 50 times greater than a capacitance at a knee point voltage of the C-V curve.

10. The capacitive parametric zero crossing detection circuit of claim 6, wherein the semiconductor device further comprises a common terminal for one of biasing or controlling.

11. The capacitive parametric zero crossing detection circuit of claim 7, wherein the semiconductor device further comprises a common terminal for one of biasing or controlling.

12. The capacitive parametric zero crossing detection circuit of claim 1, wherein the nonlinear voltage controlled capacitive device comprises a pair of nonlinear voltage controlled capacitive devices having a common terminal.

13. The capacitive parametric zero crossing detection circuit of claim 1, wherein the nonlinear voltage controlled capacitive device has a breakdown voltage of at least 130V.

14. A capacitive parametric zero crossing detection circuit comprising:
    a nonlinear voltage controlled capacitive device coupled to an input voltage to convert a zero crossing current pulse into zero crossing voltage signal;
    wherein the nonlinear voltage controlled capacitive device is a semiconductor device comprising:
    a substrate of a first doping type having a plurality of trenches formed therein;

a poly-Silicon material of a second doping type formed within each of the plurality of trenches; and metal layers applied to the substrate and the poly-Silicon material to form terminals of the nonlinear voltage controlled capacitive device.

15. The capacitive parametric zero crossing detection circuit of claim 14, further comprising a first resistive element coupled to an output of the nonlinear voltage controlled capacitive device and to ground.

16. The capacitive parametric zero crossing detection circuit of claim 14 further comprising a high-pass filter coupled to an output of nonlinear voltage controlled capacitive device.

17. The capacitive parametric zero crossing detection circuit of claim 14, wherein the nonlinear voltage controlled capacitive device comprises:

a pair of diodes; and a pair of bleed resistors coupled to the pair of diodes.

18. The capacitive parametric zero crossing detection circuit in accordance with claim 14, wherein the nonlinear voltage controlled capacitive device generates a C-V curve in which a capacitance at a near zero voltage is at least 50 times greater than a capacitance at a knee point voltage of the C-V curve.

19. The capacitive parametric zero crossing detection circuit of claim 14, wherein the substrate is an N-type substrate, and the poly-Silicon material is a P-type poly-Silicon material.

20. The capacitive parametric zero crossing detection circuit of claim 14, wherein the substrate is a P-type substrate, and the poly-Silicon material is an N-type poly-Silicon material.

21. The capacitive parametric zero crossing detection circuit of claim 19, wherein a notion capacitance of at least one of the trenches changes with a terminal voltage, the junction capacitance having a C-V curve in which a capacitance at a near zero voltage is at least 50 times greater than a capacitance at a knee point voltage of the C-V curve.

22. The capacitive parametric zero crossing detection circuit of claim 20, wherein a junction capacitance of at least one of the trenches changes with a terminal voltage, the junction capacitance having a C-V curve in which a capacitance at a near zero voltage is at least 50 times greater than a capacitance at a knee point voltage of the C-V curve.

23. The capacitive parametric zero crossing detection circuit of claim 19, wherein the semiconductor device further comprises a common terminal for one of biasing or controlling.

24. The capacitive parametric zero crossing detection circuit of claim 20, wherein the semiconductor device further comprises a common terminal for one of biasing or controlling.

25. The capacitive parametric zero crossing detection circuit of claim 14, wherein the nonlinear voltage controlled capacitive device comprises a pair of nonlinear voltage controlled capacitive devices having a common terminal.

26. The capacitive parametric zero crossing detection circuit of claim 14, wherein the nonlinear voltage controlled capacitive device has a breakdown voltage of at least 130V.

* * * * *